United States Patent [19]

Stanley et al.

[11] Patent Number: 4,801,825
[45] Date of Patent: Jan. 31, 1989

[54] THREE LEVEL STATE LOGIC CIRCUIT HAVING IMPROVED HIGH VOLTAGE TO HIGH OUTPUT IMPEDANCE TRANSITION

[75] Inventors: Michael E. Stanley, Mesa; Walter V. Lowe, Gilbert; Byron G. Bynum, Tempe, all of Ariz.

[73] Assignee: Motorola, Inc., Schaumburg, Ill.

[21] Appl. No.: 70,284

[22] Filed: Jul. 6, 1987

[51] Int. Cl.$^4$ ...................... H03K 19/02; H03K 19/01
[52] U.S. Cl. .................................... 307/473; 307/458; 307/270; 307/546; 307/563; 307/446
[58] Field of Search ................ 307/473, 270, 456–457, 307/458, 546, 563, 300, 446

[56] References Cited

U.S. PATENT DOCUMENTS

| | | | |
|---|---|---|---|
| 4,042,840 | 8/1977 | Chan | 307/270 |
| 4,081,695 | 3/1978 | Allen et al. | 307/473 |
| 4,678,943 | 7/1987 | Uragami et al. | 307/473 |

FOREIGN PATENT DOCUMENTS 2128432 4/1984 United Kingdom ................ 307/473

Primary Examiner—Stanley D. Miller
Assistant Examiner—Timothy P. Callahan
Attorney, Agent, or Firm—Michael D. Bingham

[57] ABSTRACT

A circuit is provided which comprises a push-pull switching stage responsive to applied control signals for alternately establishing high and low output voltage levels at an output of the circuit responsive to control signals which are derived from an applied input logic signal and which is disabled in response to the control signals being disabled for providing a high output impedance at the output. The circuit includes circuitry responsive to an applied disable signal for disabling the control signals while enabling further circuitry, the latter providing a transient current path to improve the transition from the high voltage output level to the high output impedance condition while establishing a pseudo high output impedance at the output of the circuit until the push-pull stage is disabled.

6 Claims, 1 Drawing Sheet

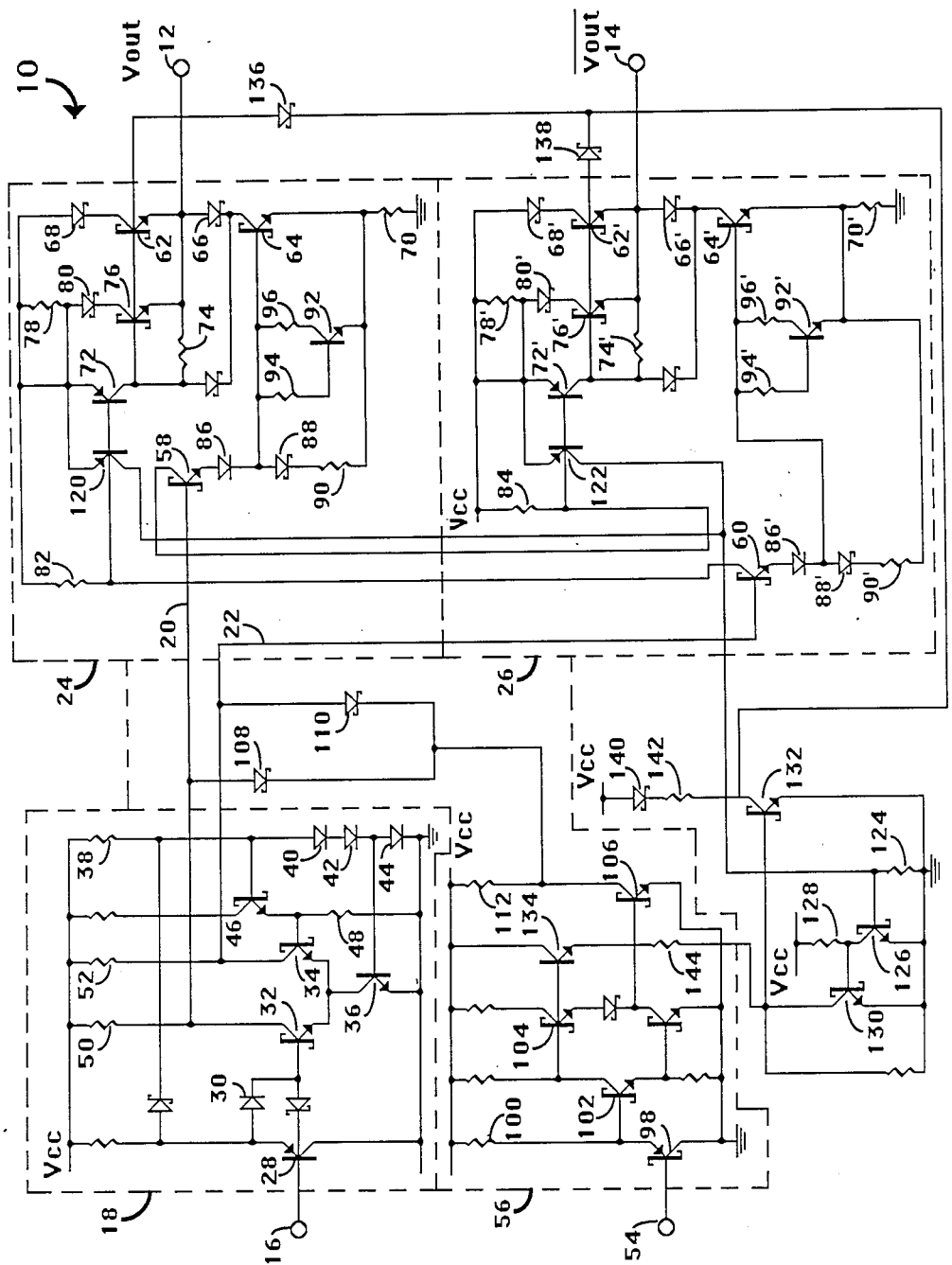

THREE LEVEL STATE LOGIC CIRCUIT HAVING IMPROVED HIGH VOLTAGE TO HIGH OUTPUT IMPEDANCE TRANSITION

BACKGROUND OF THE INVENTION

The present invention relates to logic circuits and, more particularly, to RS485 compatible line driver circuits for providing three level logic output signals in response to applied input logic signals.

Line driver circuits for meeting the requirements of EIA RS485 standards are well known. Generally, these type driver circuits are designed to provide multi-point transmission of logic data information on long bus lines in noisy environments. These driver circuits drive multi-party transmission lines and therefore when placed in a disabled state must not load the transmission line nor be affected by the operation of other driver circuits connected therewith via the transmission line.

As understood, RS485 compatible line drivers provide differential three state logic output signals in response to being driven by a TTL logic input signal. In order to be RS485 compatible these line drivers must be able to switch to a high impedance output level when disabled and remain in the high impedance state for wide positive and negative common mode voltages on the output thereof.

Line driver circuits of the type referred to typically comprise at least one output switching cell which includes a push-pull output driver stage. Generally the push-pull output stage comprises a pair of NPN transistors the collector-emitter paths of which are series connected with the emitter of the upper transistor and the collector of the lower transistor being coupled to the output of the circuit. The bases of the two transistors are differentially driven such that one of the transistors is conducting while the other is turned off. The upper transistor will therefore source current at the output to establish a high output voltage level when turned on while the lower transistor sinks current to establish a low output voltage level when turned on. The third level state occurs when the driver circuit is disabled and both transistors are simultaneously turned off thereby establishing a high impedance output level at the output of the driver circuit.

In most, if not all, prior art line driver circuits the upper transistor is supplied base drive current from a large geometry lateral PNP driver transistor. A large PNP driver transistor is required in order to supply sufficient drive current to the upper transistor so that the latter can source sufficient current to drive the load. However, this large geometry PNP drive transistor gives rise to the problem addressed by the present invention.

The size of the PNP drive transistor prevents the device from rapidly turning off when, for example, a disable signal is applied thereto. This prevents the upper transistor from rapidly turning which produces an undesirable time delay when the circuit is switched from the high output voltage level to the high impedance output state.

Thus, a need exists for decreasing the propagation delay of the line driver circuit established during switching from the high output voltage level to a high impedance output state.

SUMMARY OF THE INVENTION

Accordingly, it is an object of the present invention to provide an improved line driver circuit.

It is another object of the invention to provide a three state output cell having improved high output voltage to high output impedance transition.

A still further object of the invention is to provide a line driver circuit having improved high voltage output level to high output impedance switching.

In accordance with the above and other objects there is provided a circuit including a push-pull switching stage responsive to applied control signals for alternately establishing high and low output voltage levels at an output of the circuit responsive to control signals derived from an applied input logic signal and which is disabled in response to the control signals being disabled for providing a high output impedance at the output, the circuit including a circuitry responsive to an applied disable signal for disabling the control signals while enabling further circuitry, the latter providing a transient current path to improve the transition from the high voltage output level to the high output impedance condition while establishing a pseudo high output impedance at the output of the circuit until the push-pull stage is disabled.

BRIEF DESCRIPTION OF THE DRAWING

The sole Figure is a schematic diagram illustrating the preferred embodiment of the present invention.

DETAILED DESCRIPTION OF THE PREFERRED EMBODIMENT

Turning to the sole Figure there is illustrated driver circuit 10 of the present invention including the high output voltage-to-high impedance circuitry of the present invention as will be described. It is recognized that driver circuit 10 is suited to be manufactured in integrated circuit form. It is understood that driver circuit 10 may be utilized to provide complementary three state output signals at outputs 12 and 14 in response to receiving a single-ended input signal at input 16.

In general driver circuit 10 is conventional in structure and includes input stage 18 that is responsive to a single-ended logic signal applied at input 16, when enabled, to provide differential drive signals at respective outputs. These differential signals are supplied via lines 20 and 22 to complementary and identical output cells 24 and 26. Thus, in response to the logic input signal switching between upper and lower level states complementary output level states appear at outputs 12 and 14 to provide balanced transmission, as understood, onto a multi-user bus transmission line coupled to the outputs of circuit 10.

Input stage 18 includes PNP transistor 28 having its collector-emitter conduction path coupled between Vcc and ground reference and its base coupled to input 16. It is noted that certain resistors and other components are not specifically referenced. These components are not necessary for describing the invention and are conventional in the operation of the circuit. The emitter of transistor 28 is coupled through diode 30 to the base of Schottky NPN transistor 32. Transistor 32 has its emitter commonly connected to the emitter of Schotky NPN transistor 34 which in combination with current source NPN transistor 36 forms a differential comparator. Resistor 38 in combination with series connected diodes 40, 42 and 44 provide a direct current bias potential to the base of transistor 36 and to the base of Schottky NPN transistor 46. Hence, the base of transistor 34 is biased at a potential via resistor 48 the latter of which is connected between the emitter of transistor 46 and ground reference. A differential signal is produced across load resistors 50 and 52 which are coupled between Vcc and the respective collectors of transistors 32 and 34.

As long as driver circuit 10 is enabled, in response to an enabling signal supplied to input 54 of enabling circuit 56, differential output signals are produced onto leads 20 and 22 in response to the applied logic signal. For example, with the input logic signal at input 16 being in a high level state transistor 28 is turned off. This allows base current to be supplied via diode 30 from Vcc to turn on transistor 32. Transistor 34 is turned off. In this state the collector of transistor 32 switches to a low level output state while that of transistor 34 is switched to a high level state. Similarly, when the applied logic input signal switches to a low level state transistor 28 is turned on to steal base current drive from transistor 32 thereby turning it off. Transistor 34 is therefore rendered conductive and the output level states across leads 20 and 22 are reversed. Thus, in response to the single-ended logic input signal input switching stage 18 produces differential output signals that are supplied to output cells 24 and 26.

Lead 20 is coupled to phase splitter Schottky NPN transistor 58 while lead 22 is connected to phase splitter Schottky NPN transistor 60. Output cell 26 is identical both in structure and operation as output cell 24 and will produce the complement of the output signal produced by output cell 24. Hence, components of output cell 26 corresponding to those of output cell 24 are designated by the same but prime reference numbers. Output cell 24 comprises a push-pull output stage including upper and lower Schottky NPN transistors 62 and 64. The emitter of transistor 62 is connected to output 12 while the collector of transistor 64 is coupled through Schottky diode 66 to the output. The collector-emitter conduction paths of transistors 62 and 64 are coupled between Vcc and ground via Schottky diode 68 and resistor 70. The base of transistor 62 is connected to the collector of driver lateral PNP transistor 72 whose emitter and base are connected to Vcc and the collector of phase splitter transistor 60 respectively. Resistor 74 is connected between output 12 and the base of upper transistor 62. Conventional current sensing and limiting is provided by Schottky NPN transistor 76 in combination with resistor 78 and Schottky diode 80 the latter two of which are coupled in series between Vcc and the collector of transistor 76. The emitter of transistor 76 is connected to the emitter of transistor 62 while its base is connected to the collector of driver transistor 72. The collector of phase splitter transistor 60 is returned to Vcc via resistor 82. Similarly, The collector of phase splitter transistor 58 is returned to Vcc through resistor 84 while its emitter is coupled via diode 86 to the base of lower transistor 64 and through diode 88 and series connected resistor 90 to the interconnection of the emitter of transistor 64 and resistor 70. Transistor 92 in combination with resistors 94 and 96 form a well known transient discharge circuit for increasing the switching off of lower transistor 64 (see U.S. Pat. No. Re. 27,804).

In normal operation, as transistor 58 is turned on in response to the voltage level at the collector of transistor 32 going high current is sourced to the base of transistor 64. Transistor 64 is thereby turned on to sink current from output 12 which goes to a low voltage level state. Additionally, transistor 58 allows driver transistor 72' to be rendered conductive to supply base drive to upper transistor 62' Hence, current is sourced to output 14 causing the voltage level thereat to go high. Simultaneously, phase splitter transistor 60 is rendered non-conductive as the collector of transistor 34 goes to a low level state. This causes drive transistor 72 to be turned off thereby turning off transistor 62 while transistor 64' is also turned off. As so far described the operation of driver circuit 10 is conventional. Thus, in normal operation as, the logic input signal applied to input 16 switches between high and low level states, output 12 will switch between high and low output voltage levels while output 14 switches between low and high output voltage levels.

Driver circuit 10 is enabled to function as described above in response to an enabling signal being applied to input 54 to cause PNP transistor 98 to be rendered non-conducting. This will permit base current drive to be supplied through resistor 100 to the base of NPN transistor 102 turning it on to, in turn, turn NPN transistor 104 off. With transistor 104 nonconducting NPN transistor 106 is biased off. Hence, diodes 108 and 110 are reversed biased as their cathodes are connected to the collector of transistor 106 and through resistor 112 to Vcc. Thus, enabling circuit 56 is effectively disconnected from output cells 24 and 26 to permit normal operation thereof. To disable driver circuit 10 transistor 106 is turned on thereby driving its collector low which forward biases diodes 108 and 110 to short the bases of phase splitter transistors 58 and 60 to ground. In this condition driver circuit 10 is in a disabled state as all four output transistors 62, 62', 64, 64' are turned off.

Due to the relative large size of PNP drive transistors 72 and 72' an undesirable delay time is otherwise required to turn off upper transistors 62 and 62' when driver circuit 10 is placed in the disable state. The delay is cause by the time it take to turn of the PNP driver transistors. However, these transistors must be large geometry devices in order to supply sufficient base drive to transistors 62 and 62' which in turn must source relatively large currents to the outputs 12 and 14.

The present invention is related to providing a pseudo high impedance at the outputs of driver circuit 10 as drive transistors 72 and 72' are turned off as driver circuit 10 is disabled and the output transitions from a high voltage to a true high impedance state. This is important as driver circuit 10 may be connected to a multi-user transmission line whereby other driver circuits connected thereto cannot be utilized until the present driver circuit is disabled. Thus, by rapidly producing a pseudo high impedance to the outputs of driver circuit 10 in response to an applied disable signal even though driver transistors 72 and 72' are not completely rendered non-conducting.

Referring back to the Figure the novel circuitry of the present invention for providing rapid transition of driver circuit 10 from a high output voltage state to a high impedance output level will now be described. Once again the operation of driver circuit 10 is described with reference to output switching cell 24, it being understood that output switching cell 26 operates in the same but complementary manner as the former.

The transition circuit of the invention includes PNP transistors 120 and 122 having their base-emitter electrodes coupled in parallel with the base an emitters respectively of PNP transistors 72 and 72' of output switching cells 24 and 26. The collectors of transistors 120 and 122' are interconnected to resistor 124, the other end of which is returned to ground reference. Schottky NPN transistor 126 has its base electrode connected to the upper end of resistor 124 and its collector-emitter conduction path connected via resistor 128 between Vcc and ground reference. The collector of transistor 126 is connected to the base of Schottky NPN transistor 130, the emitter of which is returned to ground reference. The collector of transistor 130 is connected via resistor 144 both to the base of Schottky NPN transistor 132 and via resistor 144 to the emitter of transistor 134. The base of transistor 134 is coupled to the collector of transistor 102 of enable/disable circuit 56 while its collector is returned to Vcc. The collector-emitter conduction path of transistor 132 is coupled between Vcc, via series connected diode 140 and resistor 142, and ground reference and also to the cathodes of Schottky diodes 136 and 138. The anode of diode 136 is coupled to the collector of transistor 72 while the anode of diode 138 is connected to the collector of transistor 72'.

Again, during normal operation, diodes 108 and 110 are reversed bias in response to the enable signal at input 54 maintaining transistor 106 turned off. In this condition transistors 62 and 64 are alternately turned on and off as the input logic signal switches between high and low logic states. Simultaneously transistor 134 of the transition circuit remains turned off due to the enable signal such that transistor 132 is also turned off to therefore allow diodes 136 and 138 to be reversed biased. Hence the transition circuit is in a passive condition and has no effect on the operation of driver circuit 10.

To place circuit 10 in a three-level state (high impedance output) both transistors 62 and 64 turned off. To turn off transistors 62 and 64 a disable signal is applied to input 54 which turns on transistor 98 which causes transistors 104, 106 and 134 to be turned on accordingly. As previously described, diodes 108 and 110 are then forward biased to cause transistors 58 and 60 to be turned off. As transistor 58 is turned off base current is no longer supplied to transistor 64 and it is turned off. However, even though transistor 60 is turned off in response to the disable signal both PNP transistors 72 and 120 remain on due to their large geometry whereby output transistor 62 will tend to remain on absent the transition circuit of the preferred embodiment. Because transistor 120 is turned on current is supplied to resistor 124 which establishes a bias potential causing transistor 126 to be turned on. Transistor 130 is therefore in a non-conducting state whereby transistor 132 is immediately turned on by base current being supplied from transistor 134, as the latter is turned on in response to the disable signal. Diode 136 (as well as diode 138) is thus forward biased to steal base current from transistor 64 and sink the collector current from transistor 72. In this condition the output of circuit 10 is placed in a pseudo high impedance output state as resistor 74 is placed in parallel with output terminal 12. Similarly, diode 138 causes transistor 62' to be turned off and resistor 74' to be placed in parallel to output terminal 14.

Circuit 10 will remain in this pseudo high impedance state thereby effectively disconnecting output terminals 12 and 14 from any bus line that they may be connected to until such time as transistors 72 and/or 72' are turned off which condition establishes a true high impedance output state. Circuit 10 will transition from the pseudo high output impedance state to the true high output impedance state in response to transistor 120 and transistor 122 sensing when transistors 72 and 72' respectively are turned off. For example, as transistors 72 and 7' turn off transistors 120 and 122 also will be rendered nonconducting. When this happens transistor 126 is no longer forward biased and will turn off thereby allowing transistor 130 to turn on. Transistor 132 is turned off by transistor 130 becoming conducting. Diodes 136 and 138 are then turned off and the transition circuit is effectively disconnected from the operation of driver circuit 10. The transition circuit remains disconnected until the outputs are enabled, and then subsequently disabled.

Thus, what has been described above is a novel transition circuit that is utilized in conjunction with a driver circuit having push-pull output stages to allow active pull down and a quick transition from a high output voltage state to a high output state. Transition occurs by placing the output in a pseudo high output impedance condition suitable for effectively disconnecting the output of the driver circuit from any load means connected therewith until such time as the push-pull output stage of the circuit goes to a true high output impedance condition.

We claim:

1. A circuit, comprising:
an input stage responsive to applied input signals for providing first and second anti-phased output signals at first and second respective outputs;
output driver circuit means responsive to said first and second anti-phased output signals for establishing high and low output voltage levels at an output of the circuit, said output driver circuit means including first switching means responsive to a drive signal for establishing said high output voltage level when rendered conductive and driver circuit means responsive to said first anti-phased output signal for supplying said drive signal to said first switching means;
first circuit means responsive to a disable signal for disabling said output driver circuit means wherein said first switching means is rendered non-conductive such that a hight impedance is established at said output of the circuit; and
second circuit means coupled to said first circuit means responsive to said disable signal applied to said first circuit means for removing said drive signal from said first switching means and establishing a psuedo-high output impedance at said output of the circuit until such time as said driver circuit means is disabled after which said second circuit means is diabled, said second circuit means including sensing means for sensing when said driver circuit means is disabled to cause said second circuit means to become disable after a transitory period of time.

2. The circuit of claim 1 wherein:
said first switching means includes a first transistor having a control electrode and an output electrode, said output electrode being coupled to said output of the circuit; and
said driver circuit means includes a second transistor of opposite conductivity type as said first transistor and having a control electrode and an output electrode, said output electrode being coupled to said control electrode of said first transistor and said control electrode being coupled to said first output of said input stage.

3. The circuit of claim 2 wherein said second circuit means includes:
a third transistor having a control electrode and an output electrode, said control electrode being coupled to an output of said first circuit means;
diode means coupled between said output electrode of said second transistor and said output electrode of said third transistor; and
resistive means coupled between said output of the circuit and said output electrode of said second transistor.

4. The circuit of claim 3 wherein said second circuit means includes:
a fourth transistor having a control electrode and an output electrode;
a fifth transistor having a control electrode coupled to said output electrode of said fourth transistor and an output electrode coupled to said output of said first circuit means; and
said sensing means comprising a sixth transistor of same conductivity as said second transistor having a control electrode and an output electrode, said control electrode being coupled to said control electrode of said second transistor and said output electrode being coupled to said control electrode of said fourth transistor.

5. The circuit of claim 4 including a seventh transistor having a control electrode coupled to said second output of said input stage and an output electrode coupled to said output of the circuit.

6. The circuit of claim 5 including phase splitter means coupled to said first and second outputs of said input stage for providing anti-phase control signals at said control electrodes of said second and seventh transistors respectively.

* * * * *

UNITED STATES PATENT AND TRADEMARK OFFICE
CERTIFICATE OF CORRECTION

PATENT NO. : 4,801,825

DATED : January 31, 1989

INVENTOR(S) : Michael E. Stanley et al

It is certified that error appears in the above-identified patent and that said Letters Patent is hereby corrected as shown below:

Column 6, claim 1, line 43, please delete "hight" and insert therefor --high--.

Signed and Sealed this

Sixteenth Day of October, 1990

Attest:

HARRY F. MANBECK, JR.

*Attesting Officer*  *Commissioner of Patents and Trademarks*